(12) United States Patent
Wallner et al.

(10) Patent No.: US 7,304,909 B2
(45) Date of Patent: Dec. 4, 2007

(54) CONTROL UNIT FOR DEACTIVATING AND ACTIVATING THE CONTROL SIGNALS

(75) Inventors: Paul Wallner, Prien (DE); Peter Gregorius, München (DE)

(73) Assignee: Infineon Technologies AG, Munich (DE)

( * ) Notice: Subject to any disclaimer, the term of this patent is extended or adjusted under 35 U.S.C. 154(b) by 99 days.

(21) Appl. No.: 11/355,801

(22) Filed: Feb. 16, 2006

(65) Prior Publication Data
US 2006/0221761 A1 Oct. 5, 2006

(30) Foreign Application Priority Data
Feb. 18, 2005 (DE) .................. 10 2005 007 600

(51) Int. Cl.
*G11C 8/00* (2006.01)
(52) U.S. Cl. .................. 365/233; 365/220; 365/221
(58) Field of Classification Search ............... 365/233, 365/219, 220, 221, 189.08; 327/141–144, 327/291, 299
See application file for complete search history.

(56) References Cited

U.S. PATENT DOCUMENTS

| | | | |
|---|---|---|---|
| 6,073,223 A | | 6/2000 | McAllister et al. |
| 6,480,439 B2 * | | 11/2002 | Tokutome et al. .......... 365/233 |
| 6,972,609 B2 * | | 12/2005 | Shimamoto .................. 327/295 |
| 7,184,360 B2 * | | 2/2007 | Gregorius et al. .......... 365/233 |
| 2003/0002316 A1 | | 1/2003 | Morita et al. |
| 2007/0006010 A1 * | | 1/2007 | Wallner et al. ............. 713/500 |

FOREIGN PATENT DOCUMENTS

EP      1 335 269      8/2003

* cited by examiner

*Primary Examiner*—Anh Phung
*Assistant Examiner*—Hien N Nguyen
(74) *Attorney, Agent, or Firm*—Dicke, Billig & Czaja, PLLC

(57) ABSTRACT

A control unit is set up to generate and output periodic clock signals, that are in sync with and at the same frequency as a periodic basic clock that is input into it, and periodic control signals, that are likewise in sync with the basic clock, and to turn on/turn off output of at least the clock signal in reaction to an activation/deactivation signal, which is routed to it externally, to a synchronous parallel/serial converter executing synchronization and serialization of a parallel data signal with the basic clock. Whereas output of the clock signal and optionally of the control signals are turned off, immediately after the activation/deactivation signal has assumed its deactivation state, the control unit is able to synchronize turning control signals on again, when the activation/deactivation signal has assumed its activation state.

16 Claims, 9 Drawing Sheets

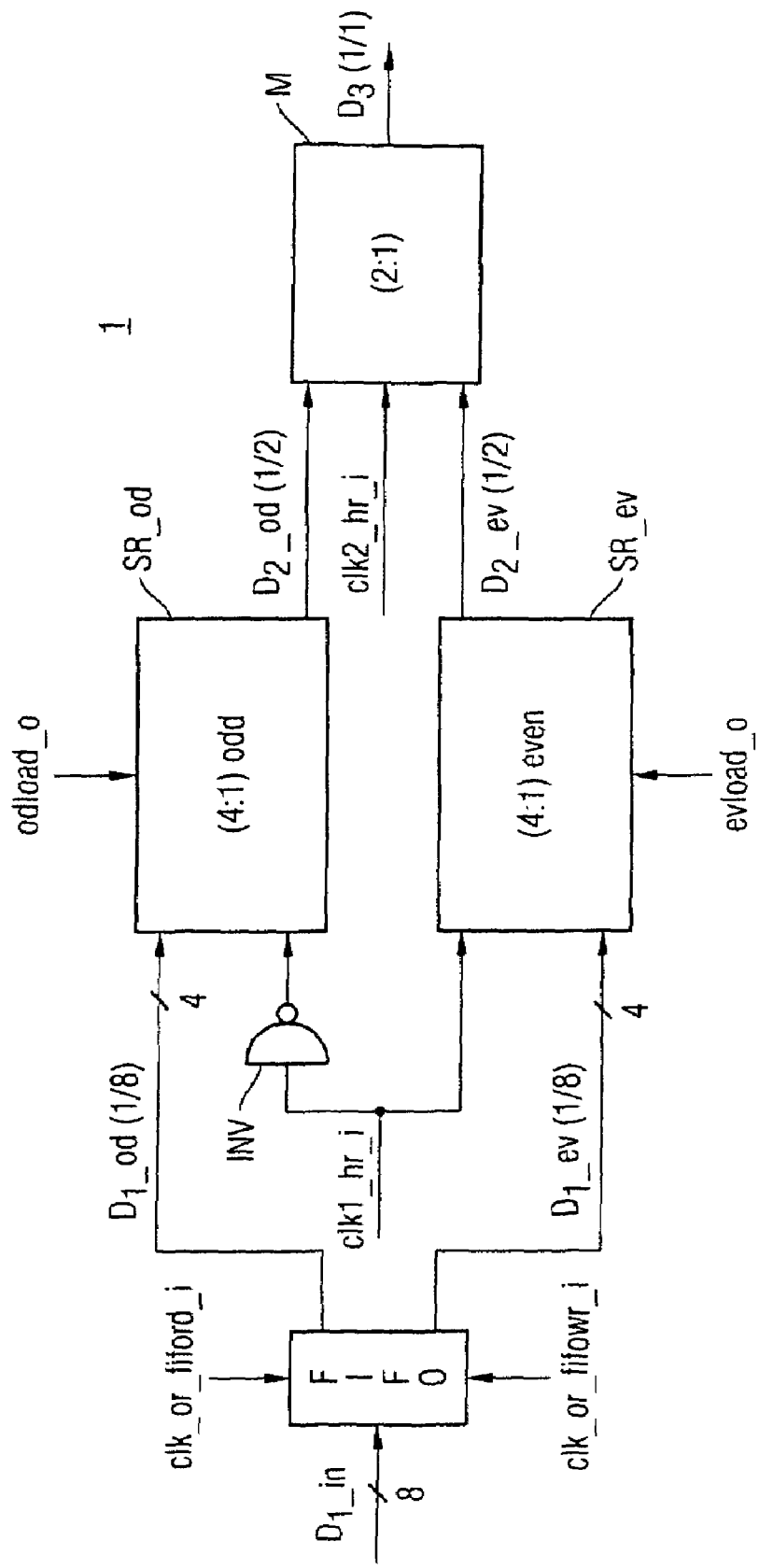

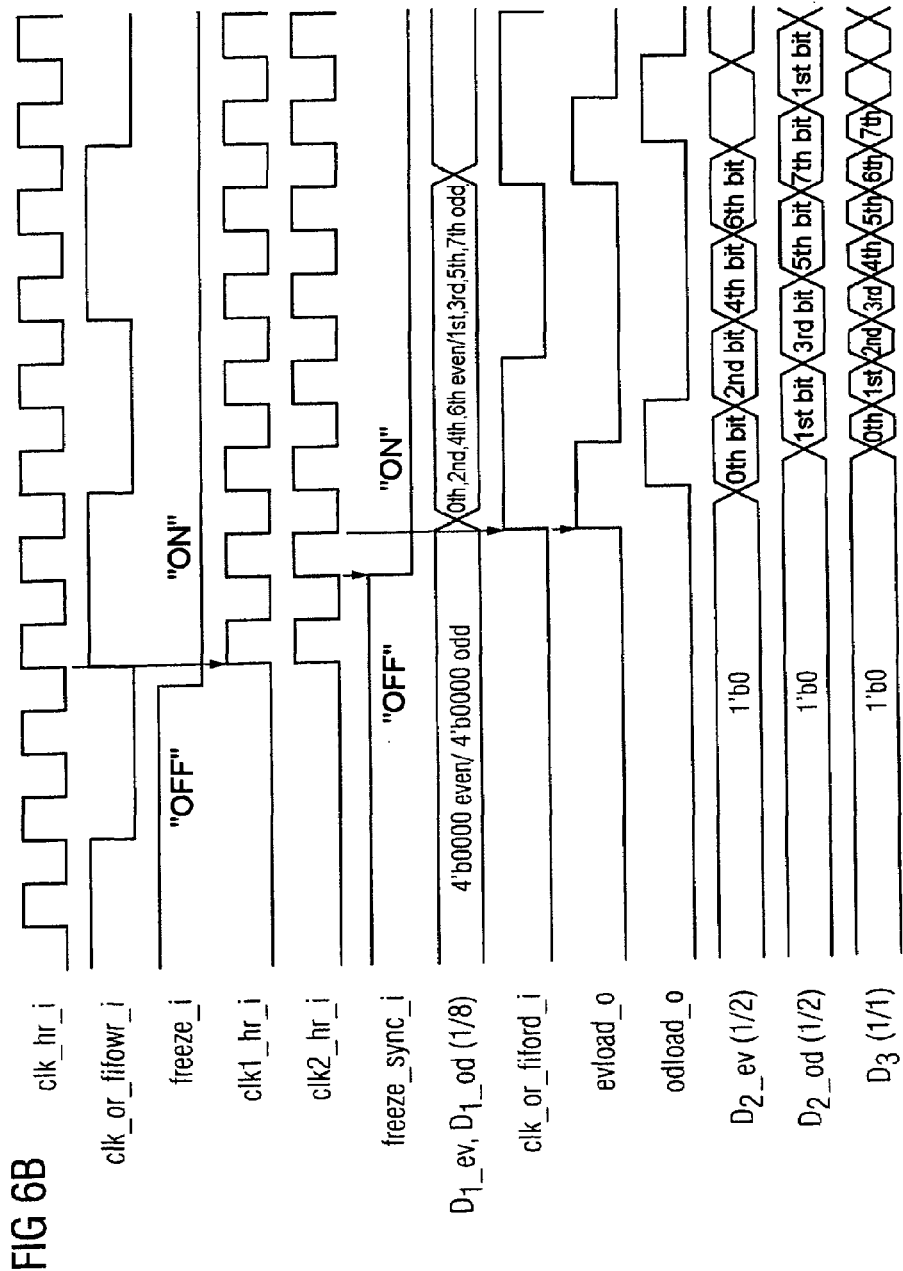

FIG 7

| State | freeze_i | freeze_sync_i | Comments |
|---|---|---|---|
| 1 | 1'b1 | 1'b0 | clk1_hr_i and clk2_hr_i are turned off immediately. No further output of $D_3$ (1/1). |
| 2 | 1'b1 | 1'b1 | clk_or_fiford_i and ev/odload_o are deactivated when they are in "0" state. $D_1$_ev, $D_1$_od are no longer output by FIFO. |
| 3 | 1'b0 | 1'b1 | clk1_hr_i and clk2_hr_i are turned on immediately. |
| 4 | 1'b0 | 1'b0 | clk_or_fiford_i, ev/odload_o are output with the correct phase relationship. Output of $D_3$ (1/1) reactivated. |

Order of states  1 → 2 → 3 → 4 → 1 etc.

US 7,304,909 B2

CONTROL UNIT FOR DEACTIVATING AND ACTIVATING THE CONTROL SIGNALS

CROSS-REFERENCE TO RELATED APPLICATIONS

This Utility Patent Application claims priority to German Patent Application No. DE 10 2005 007 600.9, filed on Feb. 18, 2005, which is incorporated herein by reference.

BACKGROUND

One embodiment of the invention relates to a control unit which is set up to generate and output periodic clock signals, which are in sync with and at the same frequency as a periodic basic clock which is input into it, and synchronous periodic control signals and to activate/deactivate output of at least the clock signals in reaction to an activation/deactivation signal supplied to it externally. This control unit can be used to control a parallel/serial converter, executing synchronization and serialization of a parallel data signal in sync with the basic clock, in the transmission interface circuit for fast DDR-DRAM memories in future memory generations and/or for a memory controller actuating said memories.

Future DDR-DRAM memory generations will have very high transmission frequencies and will be subjected to various limitations: the transmission interface circuit of such future DDR-DRAM memories will firstly need to have low power consumption and will secondly need to be able to output the data at the demanded high frequencies.

For this purpose, a control unit for generating the clock and control signals required in the transmission interface circuit is desired which can turn off said signals when no data are being transmitted.

SUMMARY

One embodiment of the invention specifies a control unit of the type mentioned at the outset such that it can deactivate at least the clock signals which are to be supplied to the transmission interface circuit when no data are to be sent, in order to reduce the power consumption of the transmission interface circuit to a significant extent. This reduction in the power consumption is more effective the higher the transmission frequency of the transmission interface circuit in such a DDR-DRAM memory.

In line with one embodiment, a control unit is set up to generate and output periodic clock signals, which are in sync with and at the same frequency as a periodic basic clock which is input into it, and periodic control signals, which are likewise in sync with the basic clock, and to activate/deactivate output of at least one of the clock signals in reaction to an activation/deactivation signal, supplied to the control unit externally, to a synchronous parallel/serial converter executing synchronization and serialization of a parallel-applied data signal in sync with the basic clock. The control unit has turn-off means which turn off output of at least the clock signal and optionally the control signals as soon as the activation/deactivation signal assumes its deactivation state, and synchronization and turn-on means which turn on output of the clock signal in sync with the next edge of the basic clock that immediately follows the time at which the activation/deactivation signal assumes its activation state.

In this way, the turn-off means in the control unit turn off the clock signal supplied to a final circuit block in a synchronous parallel/serial converter when the activation/deactivation signal supplied to said control unit has assumed its deactivation state, which normally happens a certain time after the last data item has been transmitted. This "freezes" the state of this last circuit block.

Optionally, this turning-off or deactivation can also be synchronized to the basic clock so that particular signals have a particular level.

When a new read request arises, the activation/deactivation signal is put back into its activation state. The effect of this is that the clock signal supplied to the final circuit block in the synchronous parallel/serial converter is turned on again in sync with the next edge of the basic clock, and a data stream can be supplied to the output ports. In the whole time in between, when there is no read request present, the power consumption in the synchronous parallel/serial converter forming the final stage of the transmission circuit can be greatly reduced.

Generally, the inventive activation/deactivation principle can also be applied when a plurality of DRAM chips are arranged on a printed circuit board (for example, a DIMM) and commands/read data are forwarded from one DRAM chip to the other. Each transmitter in such a repeater stage could have a similar activation/deactivation apparatus.

In line with one embodiment, the turn-off means in the control unit are also set up to turn off output of the control signals, and the synchronization and turn-on means therein are set up to turn on output also of the control signals, specifically in sync with an edge of the basic clock that occurs an integer multiple of a half clock period later than the time at which the activation/deactivation signal assumes its activation state. In this case too, output can be turned off in sync with the basic clock. This multiple of the half clock period is adjustable and is three half clock periods, for example.

In line with one embodiment, the turn-off means have inhibitor means which only allow the activation/deactivation signal to become active when the clock signal and optionally the control signals are respectively in the zero state. This is advantageous particularly when certain circuit types are being used. One embodiment produces as few interfering influences as possible when turning off.

In one embodiment, the control unit outputs the clock and control signals as respective single-bit signals to the synchronous parallel/serial converter, and the synchronization and turn-on means in the inventive control unit turn on output of the clock signals and optionally the control signals in each case in sync with a trailing edge of the basic clock.

Besides the clock signals, in one case the control unit generates two clock-synchronous control signals, specifically a first and a second control signal at the same frequency, in each case with the duty cycle 1:4 and a periodicity of four cycles of the basic clock. These two control signals have a reciprocal fixed phase difference of a half cycle of the basic clock.

In a further exemplary embodiment, the control unit also receives a periodic write signal, whose duty cycle is 1:2 and whose period is four clock cycles of the basic clock, and generates therefrom a third clock-synchronous control signal with the same duty cycle and the same periodicity as the write signal, but delayed with respect thereto by an adjustable integer multiple of a half clock period of the basic clock.

In this exemplary embodiment, the control unit contains adjustment registers which each store a value for an externally supplied adjustment signal for adjusting the respective integer multiple of the half clock period of the basic clock, in each case for the delayed turn-on of output of the first and second control signals and for delaying the third control signal with respect to the write signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3B illustrates signal timing diagrams in graphical form to explain the operation of the control unit illustrated in FIG. 2 when the clock signal which it generates is turned on.

FIG. 4 illustrates a function block diagram of a synchronous parallel/serial converter whose functions have been expanded as illustrated in FIG. 1.

FIG. 6B illustrates signal timing diagrams in graphical form to explain the operation of the control unit illustrated in FIG. 5 when the clock and control signals which it generates are turned on.

FIG. 7 illustrates a table of states of a finite state machine as a supporting explanation of the operation of the control unit illustrated in FIG. 5.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As mentioned, one embodiment of the control unit is set up to generate and output periodic clock signals, which are in sync with and at the same frequency as a periodic basic clock which is input into it, and periodic control signals, which are likewise in sync with the basic clock, and to activate/deactivate output of at least one of the clock signals in reaction to an activation/deactivation signal, supplied to the control unit externally, to a synchronous parallel/serial converter executing synchronization and serialization of a parallel-applied data signal in sync with the basic clock. Turn-off means, which immediately turn off output of at least the clock signal and optionally of the control signals as soon as the activation/deactivation signal assumes its deactivation state, and synchronization and turn-on means are provided which turn on output of the clock signal in sync with the next edge of the basic clock that immediately follows the time at which the activation/deactivation signal assumes its activation state.

Figure 1:
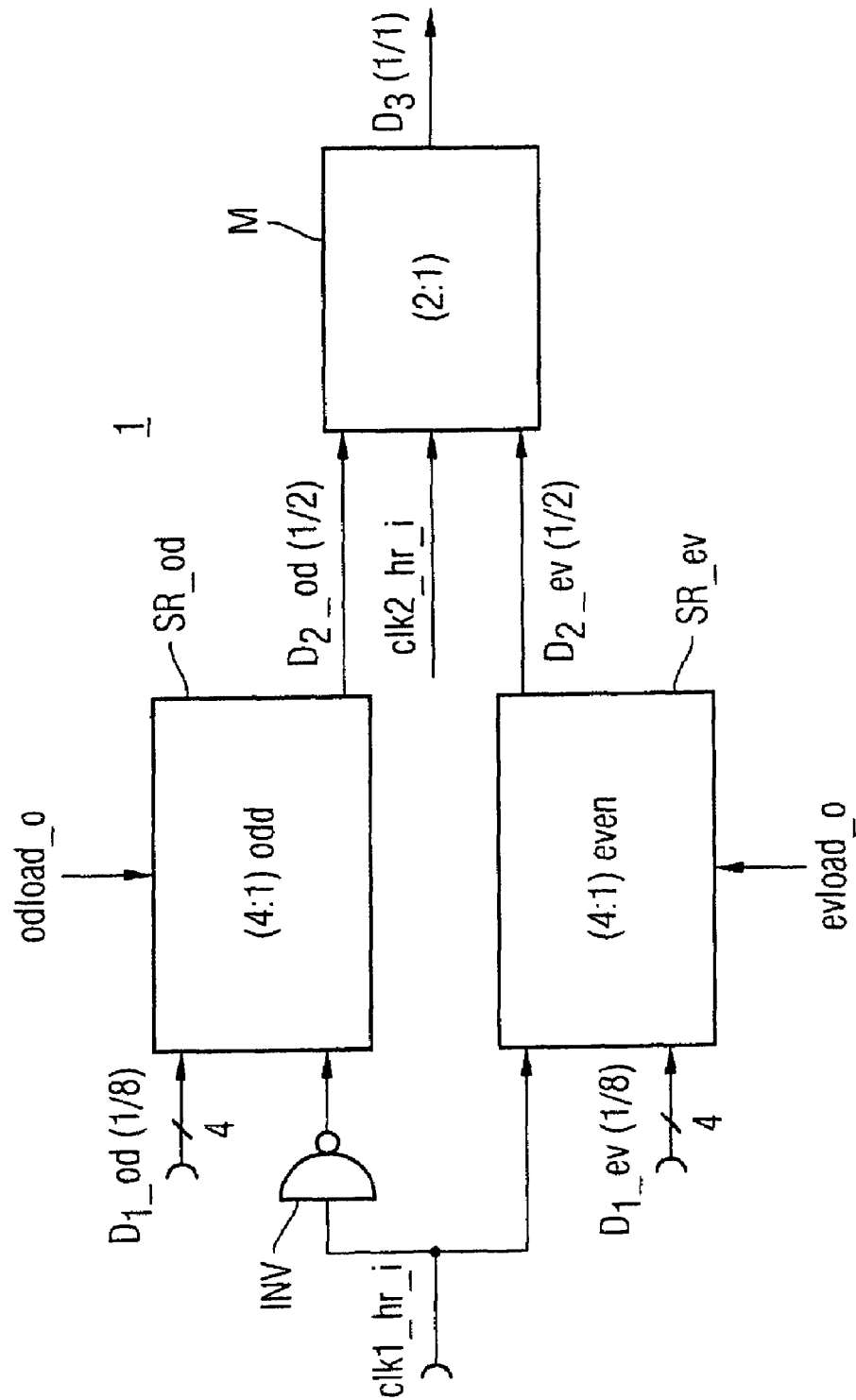
FIG. 1 illustrates a function block diagram of a synchronous parallel/serial converter designed as a stage in a transmission interface circuit in a DDR-DRAM

FIG. 1 schematically illustrates a function block diagram of a first exemplary embodiment of a synchronous parallel/serial converter 1 arranged as a final stage of a transmission interface circuit in a DDR-DRAM memory or a memory controller. Said parallel/serial converter has a first (4:1) shift register SR_od and a second (4:1) shift register SR_ev and also a (2:1) fusion unit M. An eight-bit parallel data stream, divided into a data stream D1_od including the odd-numbered four bits and a data stream D1_ev including the even-numbered four bits, respectively arrives at the first shift register SR_od and at the second shift register SR_ev.

Likewise, the units of the synchronous parallel/serial converter 1 receive a first clock signal clk1_hr_i and a second clock signal clk2_hr_i, generated from a basic clock (not illustrated) by the control unit. It should be noted that the basic clock (clk_hr_i), which is not illustrated, and the two clock signals clk1_hr_i and clk2_hr_i, which are derived from the latter in the same phase, have half the clock frequency of a system clock (not illustrated), this system clock being only fictitious within the context of what is being described here, however.

In the first shift register SR_od, a loading signal odload_o is taken as a basis for converting the odd-numbered parallel four-bit part D1_od of the incoming data into a serial data stream D2_od (1/2) in sync with the trailing (or leading) edge of the first clock signal clk1_hr_i, said serial data stream including the odd-numbered bits of the input data signal. In the same way, the second shift register SR_ev accepts the even-numbered portion D1_ev of the parallel four-bit data signal with the second loading signal evload_o and converts it into a serial data stream D2_ev in sync with the leading (or trailing) edge of the first clock signal clk1_hr_i. The two data streams D2_od (1/2) and D2_ev (1/2) which are output serially by the shift registers SR_od and SR_ev are converted into a serial single-bit output data stream D3 (1/1) in the fusion unit M in sync with the respective trailing or leading edge of the second clock signal clk2_hr_i.

It should be noted that the numbers of bits (eight bits, four bits) are merely examples and that there is no difference in phase and frequency between the first clock signal clk1_hr_i and the second clock signal clk2_hr_i. The reason for the split into the first clock signal clk1_hr_i and the second clock signal clk2_hr_i is, as explained below, that in the first exemplary embodiment the fusion unit M is frozen only as a result of the second clock signal clk2_hr_i being turned off, and hence output of the serial data stream D2 is stopped.

The first exemplary embodiment of the inventive control unit, described below, activates, that is, turns on, and deactivates, that is, turns off, this second clock signal clk2_hr_i on the basis of an externally supplied activation/deactivation signal freeze_i, in order to minimize the power consumption when no data are being read from the DDR-DRAM store.

Figure 2:
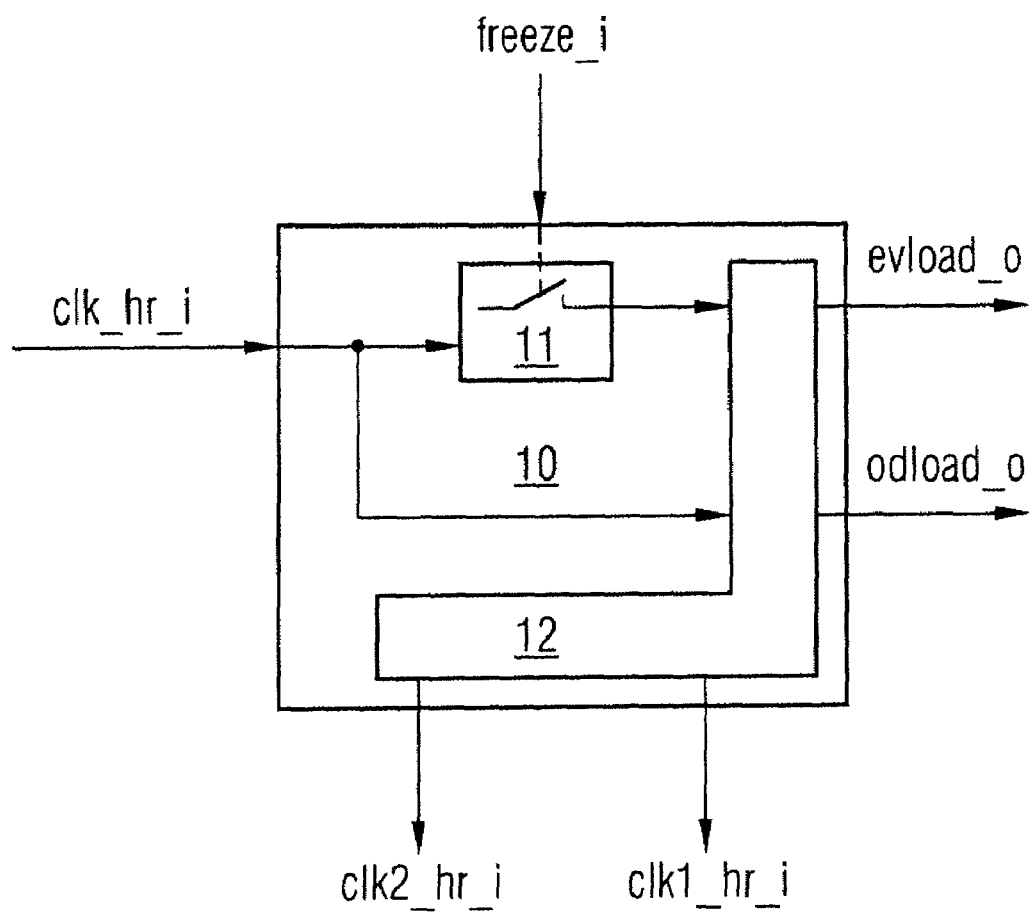
FIG. 2 illustrates a function block diagram of a first exemplary embodiment of a control unit based on the invention.

FIG. 2 illustrates a function diagram of the aforementioned first exemplary embodiment of the inventive control unit 10. This control unit 10 is supplied with the basic clock clk_hr_i and the aforementioned activation/deactivation signal freeze_i as respective single-bit signals. FIG. 2 illustrates a few function blocks required for understanding the operation of the control unit 10, namely those of the turn-off means 11, symbolized as a switch, and of the synchronization and turn-on means 12. It is clear that apart from the two clock signals clk1_hr_i and clk2_hr_i the loading signal odload_o for the first shift register SR_od and the loading signal evload_o for the second shift register SR_ev illustrated in FIG. 1 are also generated from the basic clock clk_hr_i as control signals.

Figure 3A:
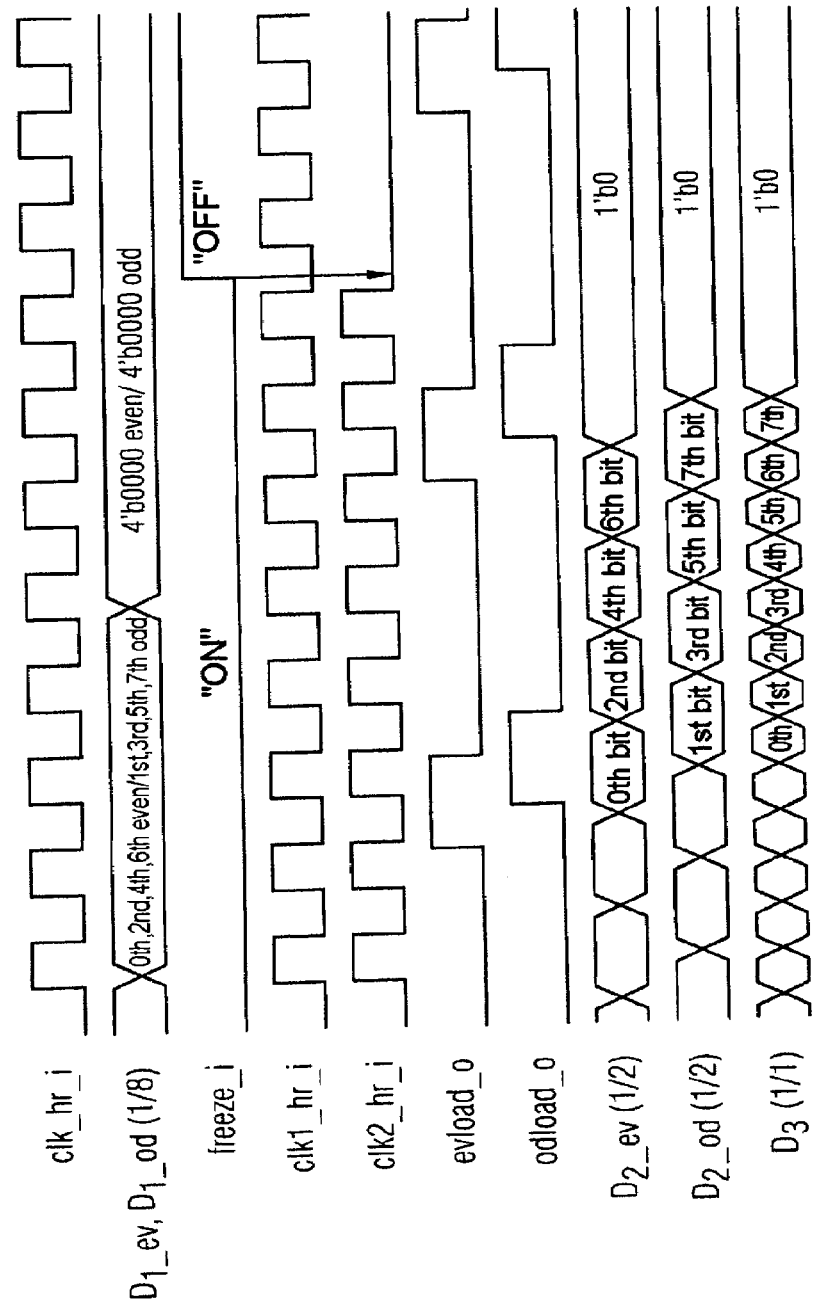
FIG. 3A illustrates signal timing diagrams in graphical form to explain the operation of the control unit illustrated in FIG. 2 when a clock signal which it generates is turned off
Figure 3B:
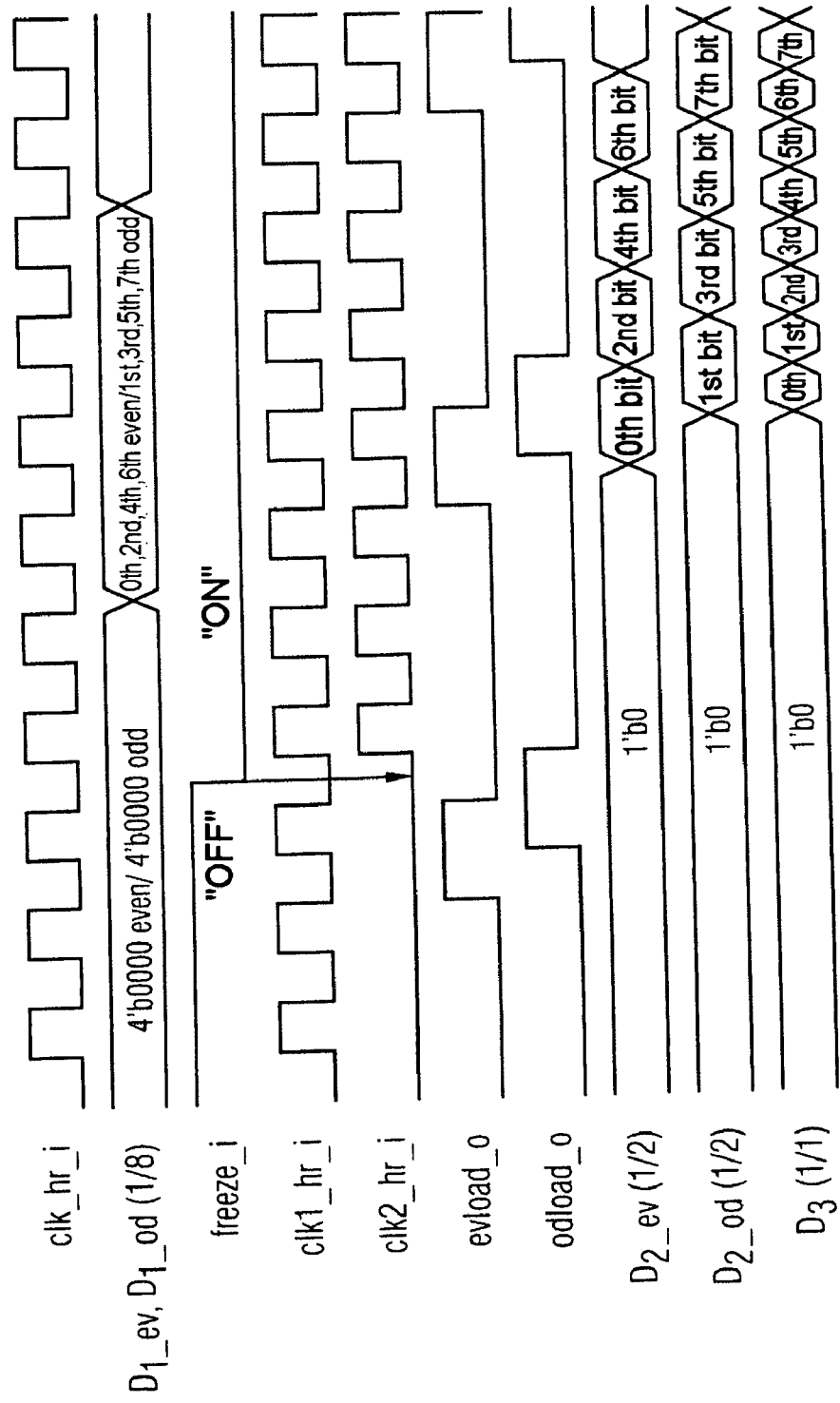

FIGS. 3A and 3B are graphical illustrations of the timing relationships between data signals, clock signals and control signals, as generated by the control unit illustrated in FIG. 2 for the synchronous parallel/serial converter 1 illustrated in FIG. 1, specifically in order to provide a respective illustration of the deactivation or "off" state and the activation or "on" state generated by the activation/deactivation signal freeze_i supplied to the control unit 10 externally. As FIG. 3A illustrates (fifth signal line from the top), the turn-off means 11 in the control unit 10 illustrated in FIG. 2 turn off output of the second clock signal clk2_hr_i supplied to the fusion unit M in FIG. 1 immediately as soon as the activation/deactivation signal freeze_i assumes its deactivation or "off" state. The first clock signal clk1_hr_i, supplied to the first and second shift registers SR_od and SR_ev in the synchronous parallel/serial converter in FIG. 1, and the two loading signals odload_o and evload_o remain unaffected by the state change in the activation/deactivation signal freeze_i. The fusion unit M provided as the last stage in the synchronous parallel/serial converter 1 can therefore neither accept the serial data streams D2_od (1/2) and D2_ev (1/2) applied to it nor output the serial output data stream D3. This is illustrated in the last three signal lines in FIG. 3A.

When the DDR-DRAM store (not illustrated) receives a fresh read request, the activation/deactivation signal freeze_i illustrated in FIG. 3B is put back into its activation or "on" state. Upon the next edge of the basic clock clk_hr_i (the leading edge in FIG. 3B), the control unit 10 turns on output of the second clock signal clk2_hr_i again, so that the fusion unit M in the synchronous parallel/serial converter 1 terminates its "frozen" state, accepts the serial data streams D2_ev (1/2) and D2_od (1/2) which are output by the first and second shift registers SR_od and SR_ev upon the subsequent loading signals odload_o and evload_o, and then outputs the serial output data stream D3 (1/1).

In the exemplary embodiment described here, no resynchronization is required when turning on, since the fusion unit M does not have any control signals "_load". There are naturally also other topologies (e.g. with an odd number of bits, e.g.=9), where the fusion unit M is also supplied with control signals. In this case, as in the case of the two shift registers SR_od and SR_ev, resynchronization is necessary when turning back on.

Whereas, in the case of the first exemplary embodiment described above with reference to FIGS. 2, 3A and 3B, only the clock signal clk2_hr_i is turned off and on again when the activation/deactivation signal freeze_i assumes its respective deactivation and activation states, the control unit 10 described below as a second exemplary embodiment (FIGS. 5, 6A and 6B) activates, i.e. turns on, and deactivates, i.e. turns off, not only the clock signals but also the control signals, supplied to the synchronous parallel/serial converter illustrated in FIG. 4, on the basis of the activation/deactivation signal freeze_i.

In comparison with the synchronous parallel/serial converter 1 which is illustrated in FIG. 1 and which is described above, the synchronous parallel/serial converter 1 which is based on the second exemplary embodiment and which is illustrated as a function block diagram in FIG. 4 is complimented by a FIFO register FIFO which is used for synchronously splitting the 8-bit input data D1_in supplied to it into the even-numbered part D1_ev (1/8) and the odd-numbered part D1_od (1/8). For this purpose, the FIFO register FIFO is supplied not only with the 8-bit input data D1_in but also with a write signal clk_or_fifowr_i which is in sync with the basic clock and has a duty cycle of 1:2 and a quarter of the frequency of the basic clock clk_hr_i for writing the eight-bit parallel input data D1_in into the FIFO register FIFO and also with a read signal clk_or_fiford_i which is generated by the control unit 10 (FIG. 5) with a delay comprising an adjustable multiple of a half clock cycle of the basic clock with respect to the write signal clk_or_fifowr_i and which has the same frequency and the same duty cycle as the write signal clk_or_fifowr_i.

In the case of the second exemplary embodiment illustrated in FIG. 4, the synchronous parallel/serial converter operates in sync with the basic clock clk_hr_i, and the functions of its components (illustrated further in FIG. 4), namely of the first and second shift registers SR_od and SR_ev and of the fusion unit M, are identical to those in the first exemplary embodiment illustrated in FIG. 1.

Figure 5:
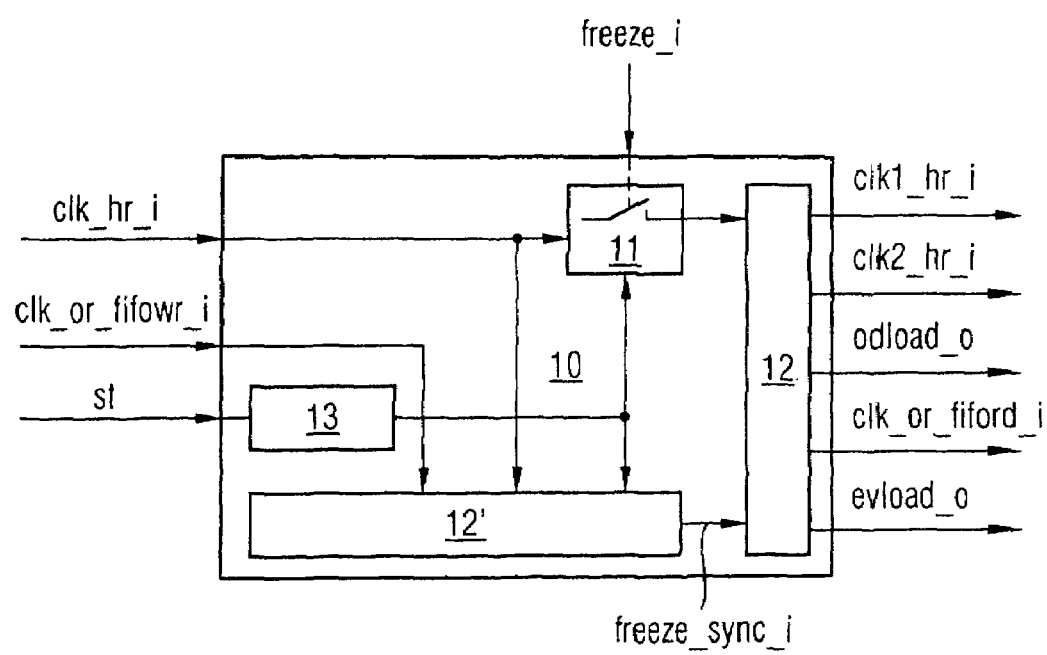
FIG. 5 illustrates a function block diagram of a second exemplary embodiment of a control unit based on the invention.

The control unit 10 based on the second exemplary embodiment and illustrated as a function block diagram in FIG. 5 first of all generates the clock signals clk1_hr_i and clk2_hr_i from the basic clock clk_hr_i. In comparison with the first exemplary embodiment illustrated in FIG. 2, this control unit 10 receives not only the basic clock clk_hr_i and the activation/deactivation signal freeze_i but also the aforementioned write signal clk_or_fifowr_i and an adjustment signal, the whole of which is denoted by st and which can program registers 13 contained in the control unit 10 for the purpose of adjusting the respective integer multiple of the half clock period of the basic clock clk_hr_i, specifically for the purpose of respective adjustably delayed activation of output of the control signals and the adjustable delay of the third control signal clk_or_fiford_i with respect to the write signal clk_or_fifowr_i.

Figure 6A:
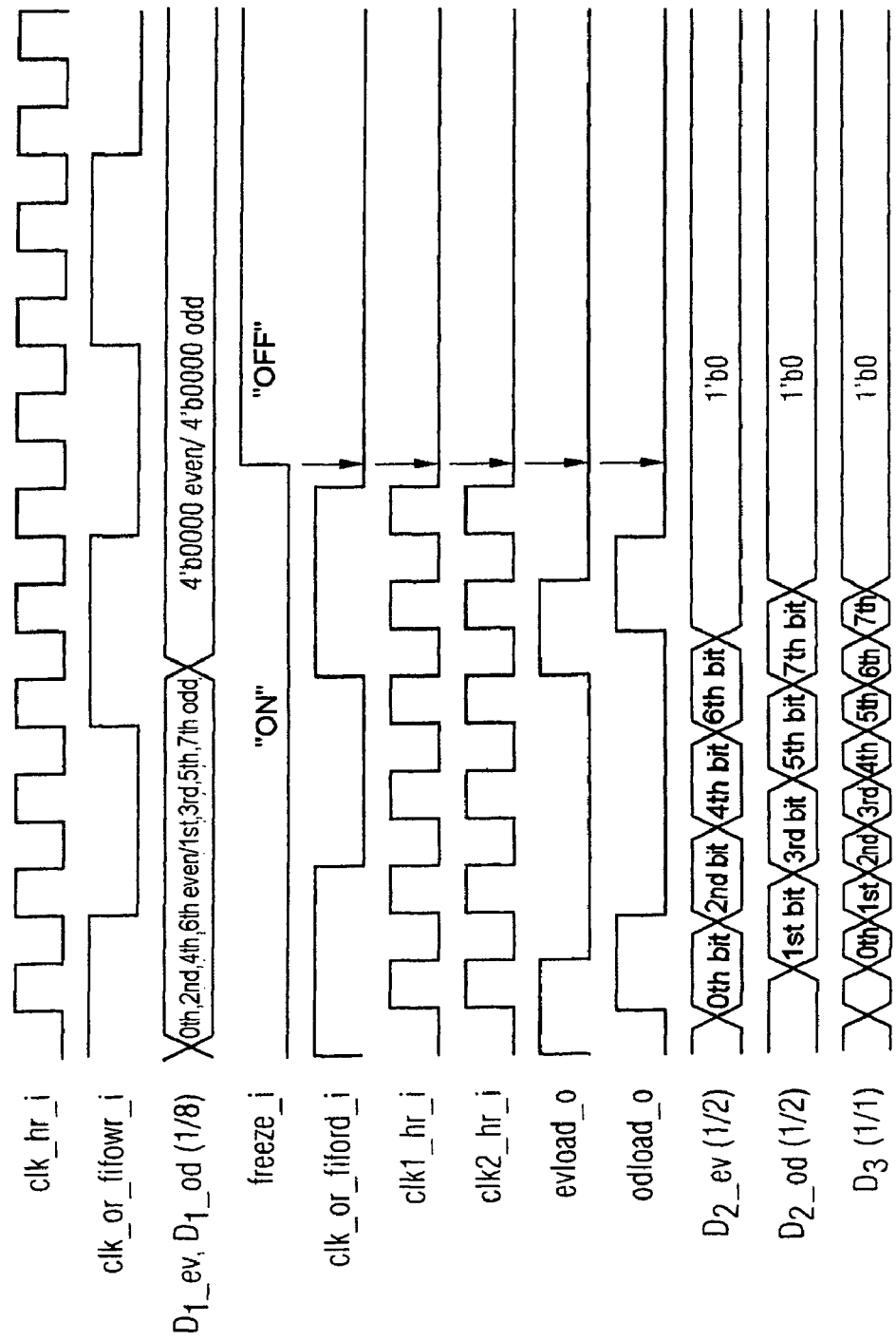
FIG. 6A illustrates signal timing diagrams in graphical form to explain the operation of the control unit illustrated in FIG. 5 when the clock and control signals which it generates are turned off

With reference to FIG. 5 and FIG. 6A, the turn-off means 11 turn off not only the two clock signals clk1_hr_i and clk2_hr_i but also the first and second control signals evload_o and odload_o and also the third control signal clk_or_fiford_i as soon as the activation/deactivation signal freeze_i assumes its deactivation or "off" state.

The turn-off operation is activated if (as FIG. 6A illustrates) the activation/deactivation signal freeze_i becomes active only when the clock signals clk1_hr_i, clk2_hr_i and also the control signals evload_o, odload_o and clk_or_fiford_i are respectively in their zero state. To this end, the turn-off means 11 in one case contains inhibitor means (not illustrated) which stop the action of the activation/deactivation signal freeze_i, as soon as this signal assumes its deactivation or "off" state, until the clock signals and control signals just mentioned are not in their zero state. Generally, this is advantageous when a single-ended CMOS signal is present. This does not apply to differential logic or CML. For differential logic, one of the two signals is always "high", for example.

FIG. 6B illustrates the operation of the control unit 10 illustrated in FIG. 5 and of the synchronous parallel/serial converter 1 from FIG. 4 when turning on again, i.e. when the activation/deactivation signal freeze_i assumes its activation or "on" state. Whereas output of the clock signals clk1_hr_i and clk2_hr_i (fourth and fifth lines in FIG. 6B) is activated again upon the next leading edge of the basic clock clk_hr_i immediately after the activation/deactivation signal freeze_i adopts its activation state, a synchronization section 12' of the synchronization and turn-on means 12 within the control unit 10 takes the asynchronously arriving activation/deactivation signal freeze_i and generates an activation/deactivation signal freeze_sync_i (sixth line in FIG. 6B) which is in sync with the basic clock clk_hr_i and whose state change from "off" to "on" is delayed by a selectable integer multiple of a half period of the basic clock clk_hr_i with respect to the leading edge of a periodic signal, in this case the write signal clk_or_fifowr_i, for example, and hence also is delayed with respect to the state change in the asynchronous activation/deactivation signal freeze_i.

In the example illustrated in FIG. 6B, the delay to the state change in the synchronous activation/deactivation signal freeze_sync_i with respect to the leading edge of the write signal clk_or_fifowr_i is two half clock periods of the basic clock clk_hr_i. To adjust to this delay time for the synchronized activation/deactivation signal freeze_sync_i, it is thus necessary to take account not only of the basic clock clk_hr_i and the write signal clk_or_fifowr_i but also of the adjustment of a register 13 by an adjustment signal st. In this case, the reference symbol "st" signals all of the static adjustment bits. This synchronized activation/deactivation signal freeze_sync_i may be used for generating the phases of the first, second and third control signals, namely of the loading signals odload_o and evload_o, in each case for the first and second shift registers SR_od and SR_ev in the synchronous parallel/serial converter 1 and also the phase of the third control signal, namely of the read signal clk_or_fiford_i, for the FIFO register FIFO.

By way of example, in line with FIG. 6B output of the third control signal, that is to say of the read signal clk_or_fiford_i, and output of the loading signal evload_o for the second shift register SR_ev starts precisely one half clock period of the basic clock clk_hr_i after the state change in the synchronous activation/deactivation signal freeze_sync_i or three half clock periods later than the first edge of the basic clock clk_hr_i after the state change in the asynchronous activation/deactivation signal freeze_i (FIG. 6B: eighth and ninth lines).

In the case of the example illustrated in FIG. 6B, the control unit 10 generates the loading signal odload_o for the first shift register SR_od with a fixed phase difference of one half period of the basic clock clk_hr_i later than the loading signal evload_o for the second shift register SR_ev. Optionally, this phase difference may also be adjustable by a register adjustment signal st in line with a setting in the registers 13. This optionally also applies to an adjustable phase difference between the read signal clk_or_fiford_i and the loading signal evload_o for the second shift register SR_ev.

In the example in FIG. 6B, the phase difference between the read signal clk_or_fiford_i and the loading signal evload_o is equal to zero. The last three lines of the signal timing diagram in FIG. 6B illustrates that output of the data streams D2_ev (1/2), D2_od (1/2) from the second and first shift registers SR_ev and SR_od, respectively, and output of the output data stream D3 (1/1) from the fusion unit M, in each case with a leading and a trailing edge of the second clock signal clk2_hr_i applied to the fusion unit M, start with a delay by one clock period or 1.5 clock periods after the state change in the synchronous activation/deactivation signal freeze_sync_i.

The activation/deactivation process for the sections of the synchronous parallel/serial converter which are illustrated in FIG. 4 can be described in the form of a finite state machine as illustrated in FIG. 7. In this case, it is assumed that synchronization with the basic clock takes place both for activation and for deactivation. A restart/reset procedure is not included here. What is important is that the states of the finite state machine illustrated in FIG. 7 are cycled in a defined order 1→2→3→4→1 etc. The finite state machine in FIG. 7 also makes it clear that the activation/deactivation signal freeze_i and the activation/deactivation signal freeze_sync_i derived and synchronized therefrom are single-bit signals. Equally, the basic clock signal clk_hr_i and also the write signal clk_or_fifowr_i and the clock signals clk1_hr_i and clk2_hr_i output by the control unit 10 and also the control signals odload_o and evload_o and also clk_or_fiford_i are each single-bit signals. The adjustment signals st can be supplied to the control unit 10 as two-bit or three-bit signals, for example.

The deactivation and activation of the synchronous parallel/serial converter 1, as described in the description above, or turning-on/turning-off of output of the data signals therefrom using the above-described functions of the inventive control unit 10 bring about a fundamental reduction in the power consumption in this synchronous parallel/serial converter 1 forming the final stage before the transmission drivers of a transmission interface circuit in a future DDR-DRAM store or in a memory control unit, as illustrated in FIGS. 1 and 4, by simply turning off said parallel/serial converter as stipulated by the activation/deactivation signal freeze_i decoded by the read command, for example, and hence drastically reducing the power consumption of the transmission drivers too.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A control unit for generating and outputting periodic clock signals, which are in sync with and at the same frequency as a periodic basic clock which is input into it, and periodic control signals, which are likewise in sync with the basic clock, and for activating/deactivating output of at least one of the clock signals in reaction to an activation/deactivation signal, supplied to the control unit externally, to a synchronous parallel/serial converter executing synchronization and serialization of a parallel-applied data signal in sync with the basic clock, the control unit further comprising:

turn-off means for turning off output of at least the clock signal and optionally the control signals as soon as the activation/deactivation signal assumes its deactivation state; and synchronization and turn-on means for turning on output of the clock signal in sync with the next edge of the basic clock that immediately follows the time at which the activation/deactivation signal assumes its activation state.

2. The control unit of claim 1, wherein the turn-off means are also set up to turn off output of the control signals, and the synchronization and turn-on means are set up to turn on output also of the control signals in sync with an edge of the basic clock that occurs an integer multiple of a half clock period later than the time at which the activation/deactivation signal assumes its activation state.

3. The control unit of claim 2, wherein the multiple of the half clock period is adjustable and is three half clock periods.

4. The control unit of claim 1, wherein the turn-off means have inhibitor means which only allow the activation/deactivation signal to become active when the clock signal and optionally the control signals are respectively in the zero state.

5. The control unit of claim 1, wherein it outputs the clock and control signals as respective single-bit signals, and the synchronization and turn-on means turn on the clock signal and optionally the control signals in each case in sync with a trailing edge of the basic clock.

6. The control unit of claim 1, wherein the control unit outputs a first and a second control signal in each case with the duty cycle 1:4 and a periodicity of four cycles of the basic clock and with a reciprocal fixed phase difference of a half cycle of the basic clock.

7. The control unit of claim 1, wherein it also receives a periodic write signal, whose duty cycle is 1:2 and whose period is four clock cycles of the basic clock, and generates therefrom a third clock-synchronous control signal with the same duty cycle and the same periodicity as the write signal, but delayed with respect thereto by an adjustable integer multiple of a half clock period of the basic clock.

8. The control unit of claim 1, wherein it contains adjustment registers which each store a value for an externally supplied register adjustment signal for adjusting the integer multiple of the half clock period, in each case for the delayed turn-on of output of the control signals and for delaying the third control signal with respect to the write signal.

9. A control system comprising:
a control unit configured to receive a periodic basic clock signal and an activation/deactivation signal, and to generate and to output periodic output clock signals and periodic control signals, wherein the output clock and control signals are synchronous with the basic clock signal and wherein at least one of the periodic output clock signals is activated/deactivated in response to the activation/deactivation signal;
a synchronous parallel/serial converter configured to receive the periodic output clock signals and periodic control signals and to execute synchronization and serialization of a parallel-applied data signal in synchronization with the basic clock signal;
means for deactivating at least one of the periodic output clock signals when the activation/deactivation signal assumes a deactivated state; and
means for activating at least one of the periodic output clock signals synchronized with a next edge of the basic clock immediately following the time at which activation/deactivation signal assumes an activated state.

10. The control system of claim 9, wherein the means for deactivating are also set up to deactivate the control signals, and the synchronization and means for activating are set up to activate the control signals in sync with an edge of the basic clock that occurs an integer multiple of a half clock period later than the time at which the activation/deactivation signal assumes its activation state.

11. The control system of claim 10, wherein the multiple of the half clock period is adjustable and is three half clock periods.

12. The control system of claim 9, wherein the means for deactivating means have inhibitor means which only allow the activation/deactivation signal to become active when the clock signal and optionally the control signals are respectively in the zero state.

13. The control system of claim 9, wherein the control unit outputs the clock and control signals as respective single-bit signals, and the synchronization and means for activating turn on the clock signal and optionally the control signals in each case in sync with a trailing edge of the basic clock.

14. The control system of claim 9, wherein the control unit outputs a first and a second control signal in each case with the duty cycle 1:4 and a periodicity of four cycles of the basic clock and with a reciprocal fixed phase difference of a half cycle of the basic clock.

15. The control system of claim 9, wherein the control unit also receives a periodic write signal, whose duty cycle is 1:2 and whose period is four clock cycles of the basic clock, and generates therefrom a third clock-synchronous control signal with the same duty cycle and the same periodicity as the write signal, but delayed with respect thereto by an adjustable integer multiple of a half clock period of the basic clock.

16. The control system of claim 9, wherein the control unit contains adjustment registers which each store a value for an externally supplied register adjustment signal for adjusting the integer multiple of the half clock period, in each case for the delayed turn-on of output of the control signals and for delaying the third control signal with respect to the write signal.

* * * * *